United States Patent [19]
Babinski et al.

[11] 3,976,330
[45] Aug. 24, 1976

[54] TRANSPORT SYSTEM FOR SEMICONDUCTOR WAFER MULTIPROCESSING STATION SYSTEM

[75] Inventors: John Paul Babinski; Bruce Irving Bertelsen; Karl Heinz Raacke, all of Essex Junction; Valdeko Harry Sirgo, Colchester; Clarence Jay Townsend, Essex Junction, all of Vt.

[73] Assignee: International Business Machines Corporation, Armonk, N.Y.

[22] Filed: Oct. 1, 1975

[21] Appl. No.: 618,654

[52] U.S. Cl. .................................. 302/2 R; 302/31
[51] Int. Cl.² ....................................... B65G 51/02
[58] Field of Search ...................... 302/2 R, 29, 31; 214/1 BE; 29/569 R, 563

[56] References Cited
UNITED STATES PATENTS

| | | |
|---|---|---|
| 2,678,237 | 5/1954 | Allander et al. ........................ 302/31 |
| 3,210,124 | 10/1965 | Niemi et al. ......................... 302/2 R |
| 3,603,646 | 9/1971 | Leoff ................................. 302/29 |
| 3,717,381 | 2/1973 | Hagler ................................. 302/31 |
| 3,845,286 | 10/1974 | Aronstein et al. ..................... 198/19 |
| 3,889,355 | 6/1975 | Aronstein et al. ................. 29/569 R |

*Primary Examiner*—Evon C. Blunk
*Assistant Examiner*—Jeffrey V. Nase
*Attorney, Agent, or Firm*—Daniel E. Igo

[57] ABSTRACT

The teaching discloses a dual bidirectional minimum volume self-centering air tract system for transporting semiconductor wafers or geometrically similar parts-in-process to and from processing tool stations in a random type manner and embodying controls to identify and collect treated wafers in segregated lots. The enclosed system is at a positive pressure to avoid ambient contamination. The enclosed track system further embodies a device for the combined computerized control of individual wafer routing in the system, humidity, temperature, and particulate content of the fluid within and utilized by the transport system while supplying and receiving wafers to processing tool stations which may have a wide variation of ambient conditions. Further the transport system embodies among other features a device for bidirectional travel with cross over intersections, directional control means, buffer sections and a fluid vector from a lower plenum for maintaining wafers centered on a fluidic cushion track so as to avoid edge contact of the wafer against any part of the apparatus and minimal backside or back flat face contact with the track membrane. The system also provides a device for sending wafers into the system and collecting processed pieces in suitable containers in lot or random form.

13 Claims, 14 Drawing Figures

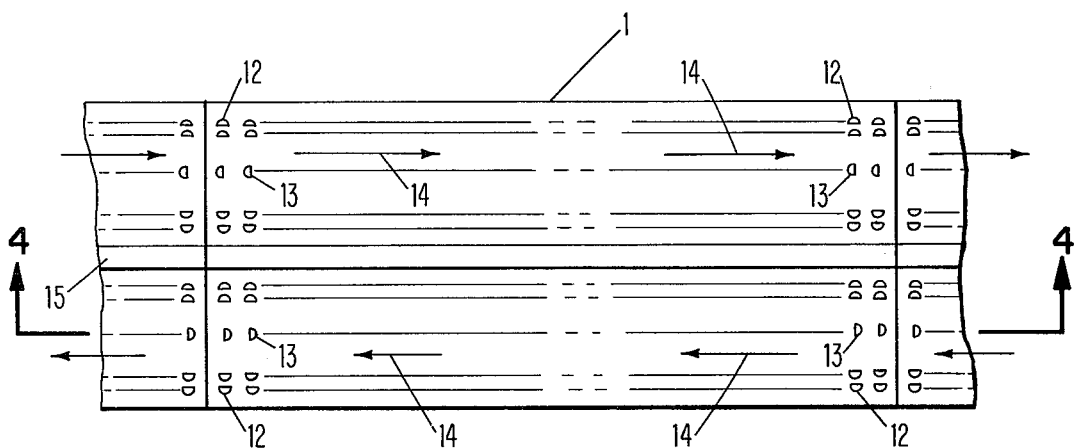
FIG. 3
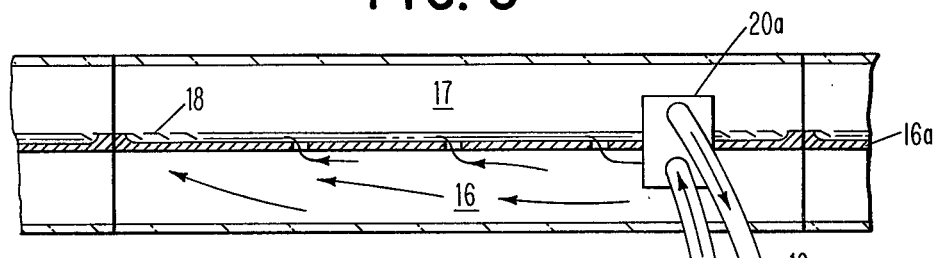
FIG. 4
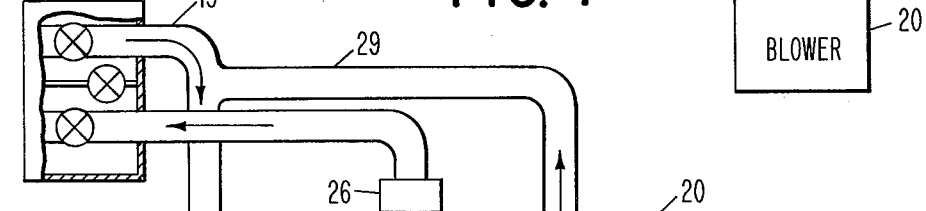
FIG. 5
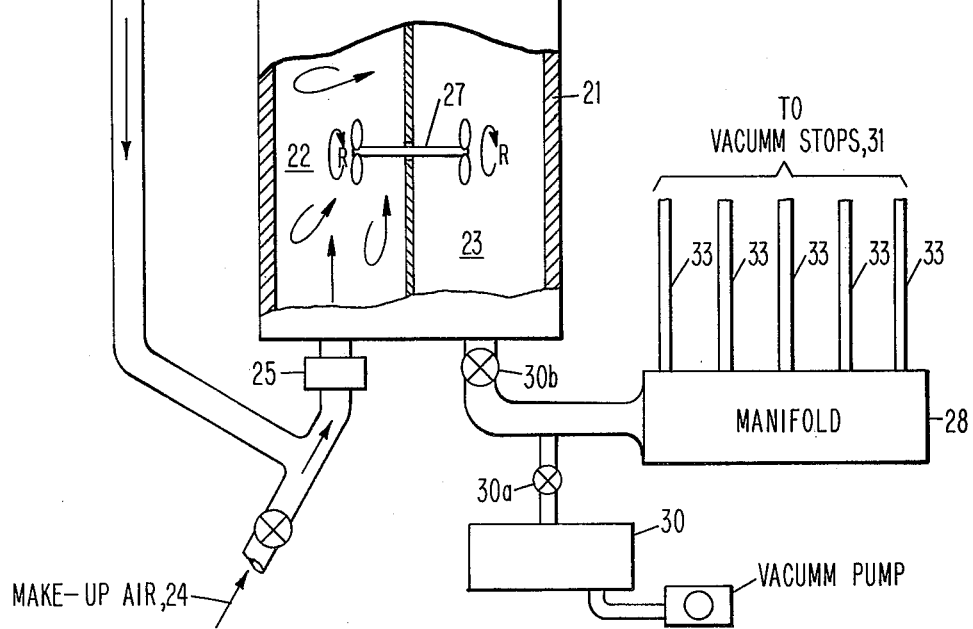

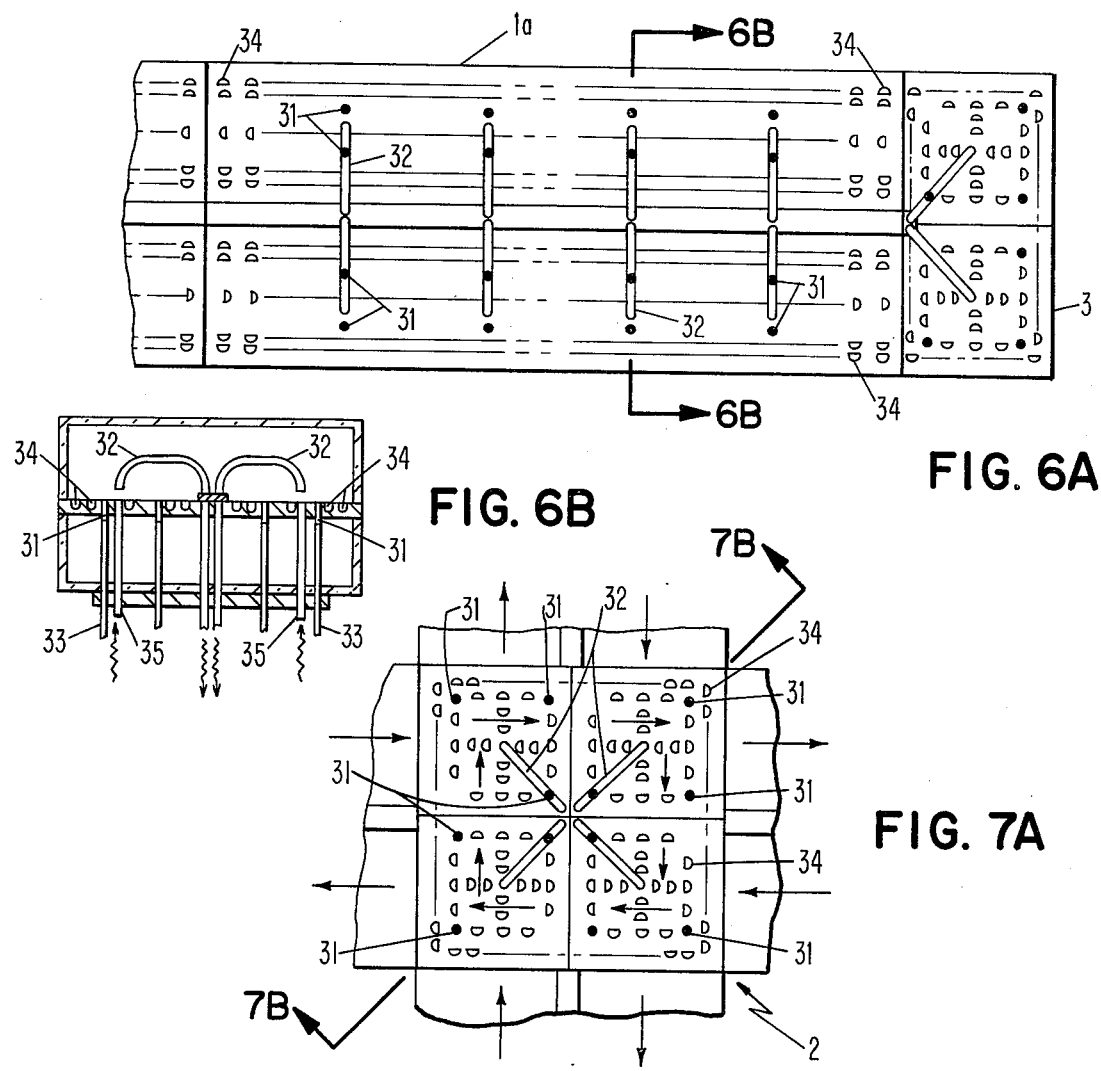
FIG. 6A
FIG. 6B
FIG. 7A
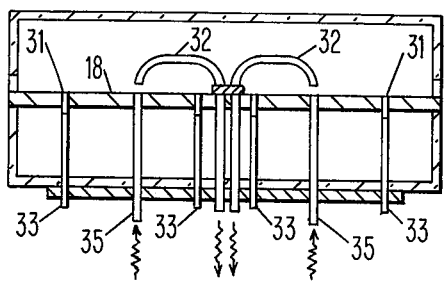
FIG. 7B
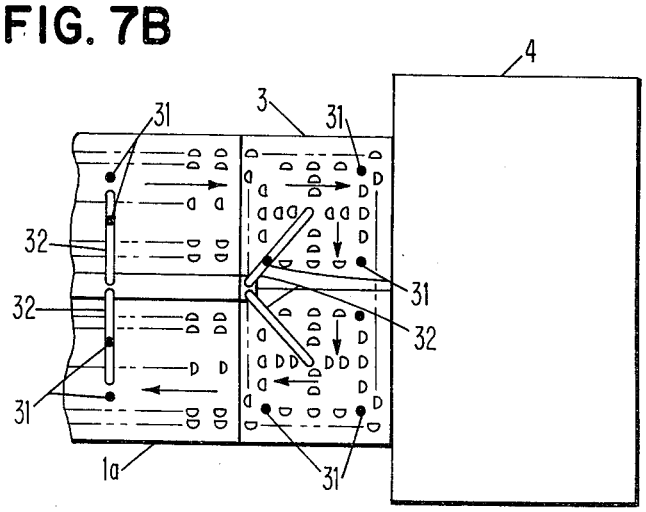
FIG. 8

TRANSPORT SYSTEM FOR SEMICONDUCTOR WAFER MULTIPROCESSING STATION SYSTEM

BACKGROUND OF THE INVENTION

1. Field of the Invention

This invention pertains in its preferred embodiment to a semiconductor wafer enclosed minimum volume fluidic cushion transport system interconnecting a multiplicity of processing stations or tools whereby any individual wafer can be randomly directed into and from a multiplicity of processing apparatus tools which are associated with said transport system. Said enclosed systems have controlled atmosphere and maintained in said condition throughout the system whereby individual wafers move in a programmed sequence from processing station to processing station without the intervention of human hands.

2. Description of the Prior Art

Prior to the current practice and trends of making semiconductor devices of greater and greater densities where more complicated and complex processing techniques are required, wafers were processed utilizing the batch technique whereby said wafers were essentially hand carried from processing station to processing station usually contained in separate rooms some of which required special atmospheric control which in turn made it necessary for the human operators to wear special uniforms and other forms of clothing. These conditions increased the cost of manufacturing semiconductor component parts as well as making product yield enhancement difficult and complex.

The art has taught sectorized processing sections wherein a central conveyor system transports wafer slices to any desired sector which may have one or a series of processing units or tools associated with a particular sector representing one serialized set of process steps comprising one mask level of processing. These sectors have preprogrammed sensing means which upon sensing the presence of a wafer at its entry port accepts same for processing. This type of arrangement uses a conveyor belt or an air cushion conveyor means or any other conveying means to transport wafers from processor to processor. Likewise a central taxi system usually an overhead type apparatus is employed to carry the wafer from sector to sector. The conveyors and processing apparatus are usually housed in "clean room" with open conveyor systems. This concept is more particularly illustrated by U.S. Pat. Nos. 3,889,355 and 2,678,237.

In a system of the type indicated above where work pieces are transported from process unit to process unit in accordance with a prescribed sequence corresponding to the processing requirements for the work piece is controlled and more particularly illustrated in U.S. Pat. No. 3,845,286.

Air cushion transport means utilizing vacuum means to stop or hold semiconductor wafers and subsequently position same is shown in U.S. Pat. No. 3,717,381.

SUMMARY OF THE INVENTION

The task of transporting thin silicon wafers with a minimum of contact between the wafer and other solid objects lead to the idea of levitation and propulsion of wafers on a lubricating fluid cushion such as air or other suitable medium film commonly referred to as an air track which in broad terms consists of a length or configuration of perforated material through which air under pressure is forced from a bottom or lower compartment or plenum; the whole being enclosed in a chamber. When a wafer passes over the jets in the track a fluidic cushion is formed under the wafer so that its own weight is balanced by a pressure force. In one configuration a central row of jet orifices or semi-circular openings is given an orientation which causes propulsion of the wafer along the track. Jets directed inward towards the center line are intended to keep the wafer centered to avoid contact with the vertical side walls of the track enclosure.

The role played by the often referred to air track as part of the total silicon wafer processing system is to provide secure, clean, and dependable transportation of wafers between various silicon wafer processing stations or apparatus which are adapted to treat the wafer in an environment entirely different from the air used in the transportation system. The enclosed system environment is so controlled as to maintain desirable temperature of the fluid, particle content, electrical charges, radiation, and the like. This is accomplished by filtration and well known other techniques to accomplish this result include the material for filtration of undesirable light. The air track in its totality includes many intersections, where wafers might be caused to stop, change direction, taught separately by Ser. No. 618,655 filed concurrently and owned by this assignee, give priority to other wafers and accelerate. The wafer can be under complete computer, semi-computer, or manual control at all time that the piece is in the transport system. In addition to intersections the system is comprised of such other arrangements as buffer sections, turn around configurations, vacuum stops, cross over means and the like in order to process semiconductor wafers either in random or sequentially through such processing steps as cleaning, etching, stripping and other wet processing as well as dry and hot processing operations as thin film additions, chemical vapor deposition steps, diffusion drive-in conditions and the addition of polymeric or other synthetic and natural passification materials. Likewise associated with the transport system and integrated and controlled with the aforesaid processing unit operations is the photolithography practice of applying and drying photo sensitive resist, the exposure of the same followed by development and the bake and dry procedure. These and other process conditions in combination with the transport system of this invention form a complete component manufacturing scheme for semiconductor componentry.

It is the object of this invention to provide an environmentally controlled and enclosed minimum volume air transport system capable of transporting work pieces such as semiconductor wafers or slices upon a fluid cushion such as air.

It is another object of this invention to provide a transport system whereby the system has such modularity so as to give significant flexibility and redundancy to the system to allow for simultaneous continuous processing and maintenance as well as ease of adding new or different and deleting processing units as product demands may dictate.

It is another object of this invention to provide a fail safe air transport system whereby collision between work pieces is avoided.

Another object is to provide a system configuration which optimizes flow for thruput while minimizing processing tool count.

Another object is to provide relief (thru system configuration) from usual high tool reliability requirements of strictly serialized automation.

Another object is to provide ability to add and split lot test any new tool without disturbing its predecessor.

Another object is to provide an optimum line organization to localize like processor as a benefit to facilities distribution and maintenance.

It is still a further object of this invention to provide a processing transport system which will allow for alternate route choices between processing units as well as an associated computerized control system which will allow complete or partial automation as well as a combination thereof.

It is still another object of this invention to provide a system whereby the location and condition of every work piece is known at all times.

A more complete understanding of the invention and other objects and advantages will be apparent from the following more detailed description taken in conjunction with the accompanying drawings.

DESCRIPTION OF THE DRAWINGS

FIG. 3 is a top plan view of the air transport membrane showing semi-circular air jet openings providing vectorized air forces for air cushion formation.

FIG. 4 is a sectional side view of the enclosed air track illustrating the lower plenum and the upper membrane above which the air transport cushion is formed and a partial plan in section of the fluid supply system and the associated blowers and filtration units.

FIG. 5 is a section of the air blower and vacuum mechanism illustrating the fail safe feature of the system in the event of power supply failure.

FIG. 6A is a schematic illustration of a buffer hold up section.

FIG. 6B is a section of 6A as indicated.

FIG. 7A is plan view of an intersection and vacuum stop control.

FIG. 7B is a section of 7A as indicated.

FIG. 8 is a plan view of a turn around section associated with a processing station and fluid transportation section.

DESCRIPTION OF A PREFERRED EMBODIMENT

Figure 1:
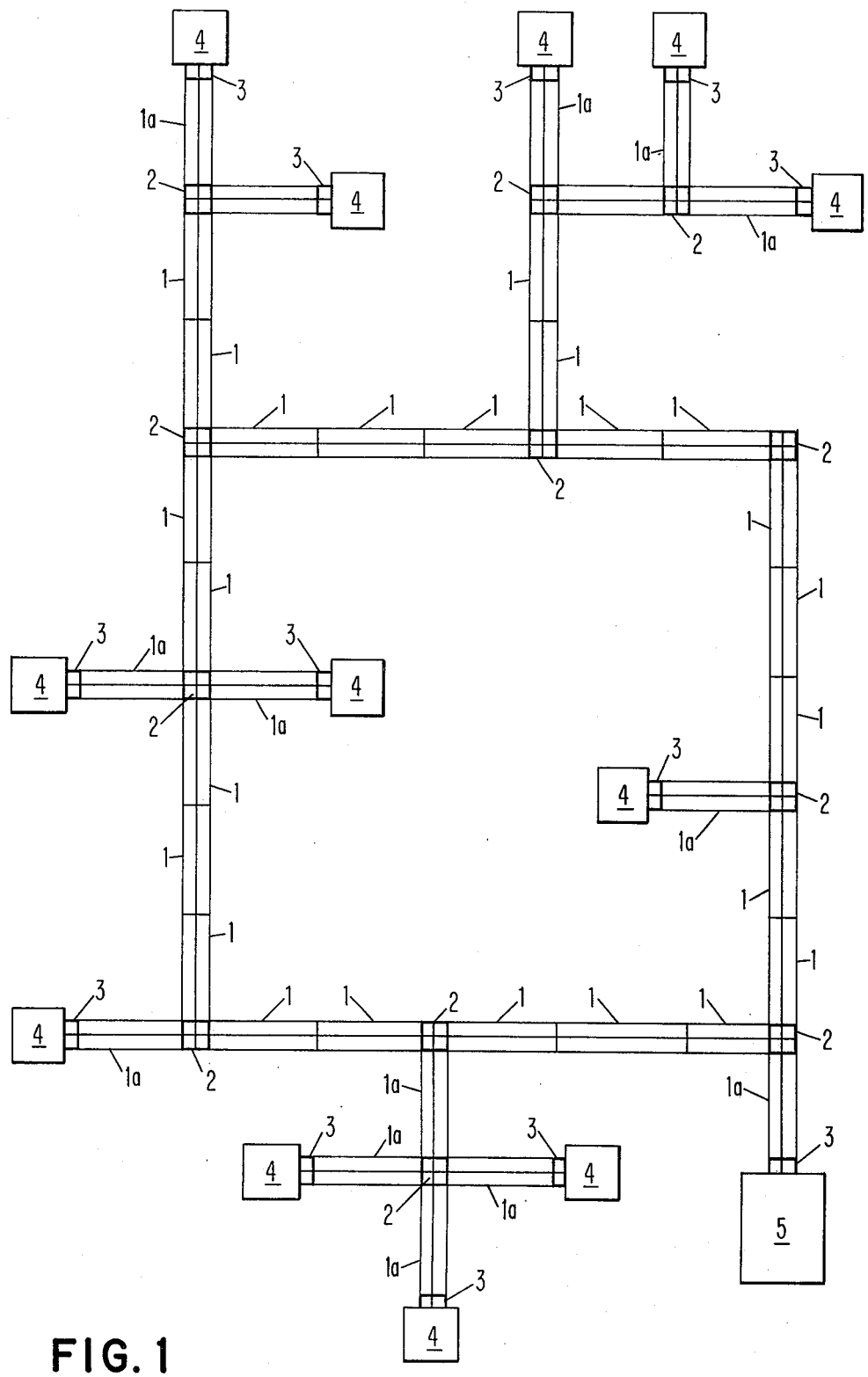
FIG. 1 is a diagrammatic illustrative representation in plan view of random configuration transport system and associated process units.

Referring now to the drawings the self-centering fluid air track system is a configuration for transporting semiconductor wafers from place to place or from processing unit to processing unit without making contact with the wafer except for a non-abrasive vacuum stop contacting the back of the wafer for stopping and turning the wafer. The system may be of any configuration or shape and FIG. 1 is illustrative of one form of the system showing a double track system made up of modular straight track sections 1 having intersections 2 and holding buffers 1A whereby the wafer may be directed in various directions. Also illustrated are turn around sections 3 all associated with semiconductor processing stations 4. A system entrance and exit 5 is also provided. The entrance and exits may be at different locations in the system and separated from one another.

In addition holding buffer areas are provided with the entrance to each tool whereby a wafer or wafers can be held or maintained in a holding configuration if for any reason the processing station is not in a condition to receive the wafer or the wafer may be turned around and travel to another or redundant or standby processing unit.

Figure 2:
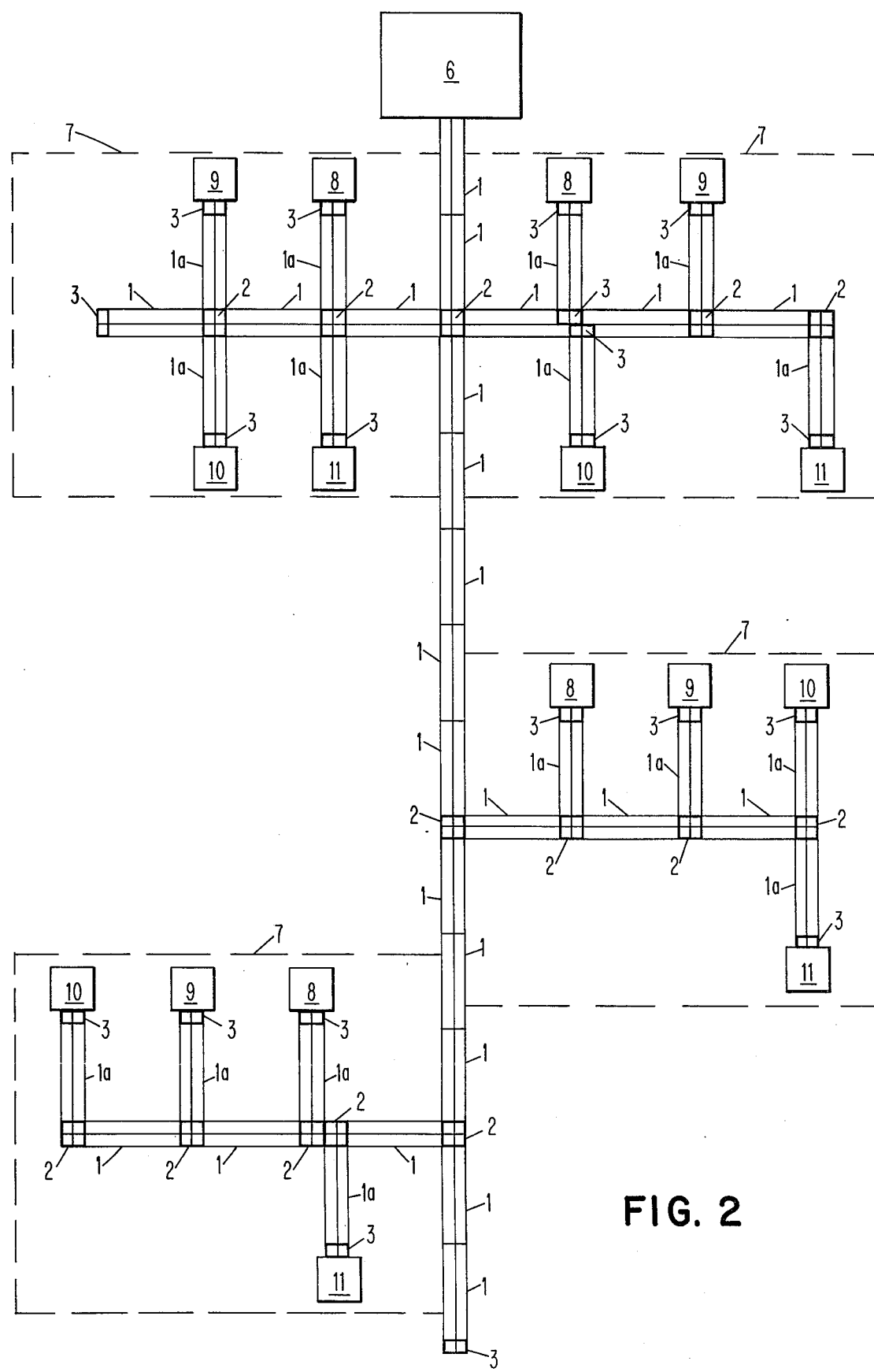
FIG. 2 is a diagrammatic illustrative representation in plan view of a sectorized transport system wherein a central common track arrangement provides work pieces to processing units associated with each sector.

FIG. 2 is illustrative of a different system configuration whereby sectors 7 are disposed from a central fluidic transport track system having the same operational sections mentioned above in the first illustration, with an inlet-exit at 6 or each sector can stand alone and operate manually in a manner whereby each sector has an inlet-exit means at the beginning of each sector and a series of processing units such as 8, 9, 10, and 11 attached to each sector.

It should be emphasized that the system described by this specification is an enclosed minimum volume fluidic (e.g. air or inert gas) transport system for conveying semiconductor wafers to and from various processing stations where such operations as clean, etch, and strip are performed as well as hot processing such as thin film formations, chemical vapor deposition, sputtering diffusion drive-in steps and passivation using synthetics as well as well known oxides and glass compositions. In addition photolithography steps such as apply and dry, expose, develop and back are undertaken at appropriate units. The system may be one unitary configuration or one or more separate systems interconnected manually or automatically as the case may be or circumstances require.

The system is comprised of modular enclosed sections allowing for minimum volume air or gas use as well as provide minimum space environmental control. All of which provide manufacturing conditions with maximum flexibility making processing units or tools accessable using any desired predetermined path as well as alternate routes. A combination of manual and automatic operation and control is utilized whereby tools may be by-passed or employed.

In summation we have provided a fluidic transport system with modularity, flexibility, environmental control and a minimum volume enclosure and associated programmed computer control in its entirety or locally at intersections or process unit groupings.

The apparatus of the system is composed of a lower plenum through which recirculated and filtered air or gas mixture is supplied to an upper enclosed plenum through a membrane surface where upon a fluid cushion is formed such as air or other gas utilizing vectorized forces for centering the wafer as well as propelling the wafer in the desired direction. Each section provides a dual track or multi-direction system whereby wafers are simultaneously traveling in opposite directions.

FIG. 3 and FIG. 4 illustrates the concept wherein semicircular gas jets 12 are provided to maintain the wafer in the center of the track and propelled by jets 13 in the direction of the directional arrow 14. A superficial separation of the bidirectional track is provided at 15 this can be of any suitable material such as a plastic strip as an emergency means for preventing a wafer cross over. FIG. 4 is a section through 4—4 and illustrates the lower plenum 16 and a manifold or secondary plenum 16a and the upper plenum 17 and the membrane or air cushion floor 18. Material of construction for these modular sections is transparent plastic material or any other metallic or synthetic of any desired thickness while the membrane floor may be of their metallic or plastic material and each modular section being connected to one another and having a lower air supply blower means to the lower plenum and a return 19 from the upper plenum to a dual compartment blower 20 from a transition box 20a for filtration and recirculation with make up air. The blower 20 is a dual compartment arrangement which provides a pressurized air and vacuum as required. This mechanism and manner of operation will be detailed and described subsequently in connection with the air and vacuum system combination.

FIG. 5 illustrates the dual blower mechanism for supplying air or gas pressure to the system and vacuum for vacuum stop means. The blower casing or enclosure 21 is made up of two compartments one section 22 for pressure and the other 23 for vacuum development. Make up air 24 is supplied from any suitable source through a filter 25 into air pressure compartment and exited to the lower plenum of the air track through a second filter 26. The common shaft blower for each section in the case vacuum 27 pulls air from a common manifold 28 that runs to any desired length of the air track and which is connected to vacuum stops on the air track membrane. The exit from this chamber 23 is fed into the recirculated gas 29 and filtered medium being exited from the upper plenum and is filtered through filters 25 and 26 with the make up air. Associated with the manifold 28 is an evacuated tank 30 which is connected to a vacuum pump or house vacuum system and having the appropriate check values 30a and b. This arrangement in the event of power failure in combination with pressurized air flow fall off will supply adequate vacuum at the next stop to hold wafers in a safe and noncollided position under emergency conditions. It should be understood at this posture that any system configuration may require from one to a multiplicity of fluid supply and vacuum arrangement as illustrated in FIG. 5. This arrangement illustrates a valving sequence whereby make up on system start up air may be circulated and filtered prior to system entrance. This will depend by and large upon the system configuration and over all air and vacuum requirements.

The air blower and recirculation and filtration arrangement allows environmental control in a manner that can maintain the air within the system at a class 100 or below said level as defined by U.S. Bureau of Standard Specification for air or gas contamination. While vacuum formed by the adjoining side of the blower is capable of holding a negative pressure at the vacuum stops of approximately 2.5 inches of water. Similarly humidity and temperature is controlled within the system by any suitable means.

A system of the type herein disclosed and for a preferred purpose of processing semiconductor wafers requires hold up sections on buffers which function by use of the pressurized air supply, vacuum stop, and a sensing means.

FIG. 6A illustrates a buffer configuration with a sectional view through 6B—6B and may be referred to as a storage buffer. Firstly, the vacuum throughout the system is always in an on negative pressure configuration so that when a wafer or a work piece in the system reaches a vacuum stop means it is stopped and released as programmed by a means of a solenoid or similar means terminating the vacuum pull.

Therefore, as a wafer, for example, reaches vacuum two point stop 31 and is sensed by the fiber optical light pipe 32 this is addressed in the computer and in accordance with a programmed system can be moved to any part of the buffer including proceeding on into a processing tool or turned around in the opposite direction as the case may be. The illustration contains eight wafer positions for storage or waiting for movement to another location or into a processing apparatus dependent on the traffic pattern and the processing program for that and each particular wafer. The sectional view FIG. 6B shows the fiber optics light and emitting means 35 and sensing means 32 and the vacuum stop line 33. It can be seen that as the wafer is stopped and upon forward or other clearance being formed the vacuum is released and the cushion carries the wafer in the programmed direction by means of a signal from a computer or other means to activate a valve to release vacuum and apply the appropriate gas vectors. Air flow jets are shown at 34.

FIG. 7A is a typical intersection of two pairs of one way traffic lanes utilizing air or any suitable fluidic means. The four intersection module is referred to as a quad. By using such a configuration at all intersections of the system it is readily apparent that if processors, testers, measurement devices and the like required to process wafers or other products transportable in the manner herein described were interconnected it is possible to transport units throughout the system automatically without handling damage.

Figure 9A:
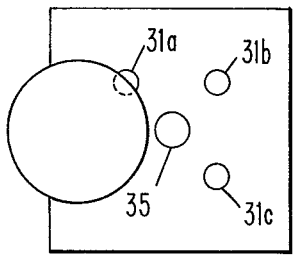
FIG. 9 is a schematic illustration of a vacuum stop configuration for centering and directing a wafer at an intersection.
Figure 9B:
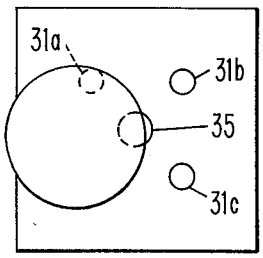

The control of traffic at intersections in the configuration illustrated by 7A and 7B is one of the keys to the flexibility of the system of this invention. The sensor 32 indicates the arrival of the wafer when the light source is blocked resulting in a signal to a computer or other suitable device. The vacuum stops 31 are used to stop wafer travel until direction of exit is determined. FIGS. 9A, B, and C more adequately illustrates this operation. Consider the wafer entering from the left and being held by the first stop 31a and rotating on said stop 31a coming to rest when reaching stop 31b and 31c. Vacuum is controlled by means of solenoids which are active only when releasing the wafer. This ensures vacuum if power fails, to use minimum energy, and to ensure cool and reliable operation of the solenoids.

Figure 9C:
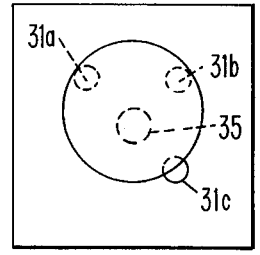

At the center of each single intersection a light shines up from a light source to a fiber optic light pipe 35 carrying the light to a sensor. When the wafer breaks the light path, its presence is detected by the electronics by means of a preprogrammed address to a computer or other suitable device. After sensing the wafer in place it is necessary to delay releasing the wafer until the wafer comes to rest as shown in FIG. 9C. It is readily apparent from FIG. 7A the flow of air will center the wafer since air flows from all directions towards the center of the intersection. Therefore, if the wafer was vacuum released after coming to a stop, it would remain in the intersection. It is necessary to terminate the air flow on the exit side of the intersection. This is accomplished by means of solenoids which are activated by an appropriate signal to a preprogrammed computer address.

Figure 10:
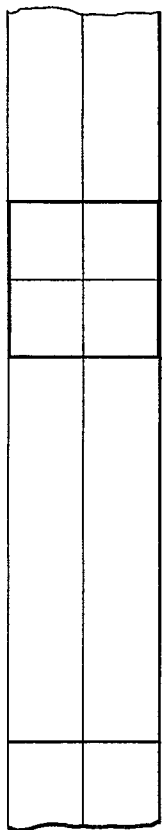
FIG. 10 illustrates diagrammatically a storage buffer arrangement.

In conjunction with a part of the system is a storage buffer means shown in FIG. 10 whereby a buffer configuration capable of holding 32 wafers is attached to one point or section of the system matrix. At each wafer position there are vacuum stops and sensors. The wafers are moved up one at a time as a position ahead on in front of it is vacated. This is accomplished by a signal generated by the light pipe action to a preprogrammed computer or other appropriate device. Wafers are not released until the one ahead of it is released and reaches the next position. The wafer at the exit may be released so as to leave the buffer or may be recirculated back into the buffer if it has no place to go allowing other wafers behind it to be reached. This feature permits efficient use of buffers allowing mixed batches to share the buffer. Sorting of wafers can also be accomplished by using this circulatory technique and is easily understood by one skilled in the art.

As previously expressed and illustrated in FIG. 6 before each processing tool an in-line buffer is provided both on the input and output of the tool as well as a turn-around means illustrated in FIG. 8 wherein a wafer from the buffer section previously described is detected by the light source and optical light pipe 35 and 32 and held with vacuum stops 31 at which posture the air is preprogrammed adjusted through means of an appropriate signal generated by the light pipe to enter the tool or processed in a left direction for travel to another area in the system. The purpose for this buffer is to hold wafers temporarily while waiting in or out position for either processing or for a turn in the system to another processor. The first position of the input buffer is a controlled intersection and may send wafers on command to either the tool or to the first position of the exit side of the buffer. The latter would be designated as by-passing the tool and would occur when the tool was not operational and it was desirable to retrieve the wafers in the input buffer for processing in a redundant tool or for storage elsewhere in the system.

This system may incorporate a panel which would constantly show the updated status of the system or any part thereof. Information collected from the system for control and monitoring purposes could be used. The panel would be constructed in such a way as to roughly represent the presence of a wafer. A string of lights between intersections would indicate the direction status of each intersection and thereby show the path to be used. Indicators on the blocks representing processing units would warn of malfunctioning equipment. The panel used as a map would aid in manually preparing the system for traffic control.

In completely automatic or computer mode operation the system is a buss oriented system whereby the system can be monitored and controlled from a central point. The buss, for example, might contain 11 addresses, 9 controls, and 20 status lines. By using a buss to collect status information from one point, either an intersection or processor, at a time and responding with appropriate control information. A very large system can be controlled from one 40 wire buss plus ground. The system as illustrated in this preferred embodiment will address 255 intersections with an average of 2 processing units serviced by each intersection. The buss runs from station controller to station controller and ultimately to the system central controller. At each station controller data is collected from all intersections and processing units associated with the intersection it controls. This information is then gated to the buss when the particular intersection or processor is addressed. The central controller has a polling function which incrementally advances the address lines and looks for wafers at a location wishing to be serviced. At this point the polling clock is stopped and interupt is given to an IBM System 7 sensor based computer. Conditions under which the central controller will service may be as follows: wafer present at an intersection or processor output location, wafer arrival at input to processor, change of processor status and the like. The computer then responds with control information based on traffic control ground rules and stored wafer routings. A program is developed to maintain and control the system in accordance with the standard and well known programming techniques.

In a semi-automatic mode, it is possible to set up a predetermined routing for the system by use of a programmable read only memory or a small disc system in one sweep of the poll. Sets of these predetermined routings could be called in sequence as batches of wafers traverse the system. For a less sophisticated system or for emergency use, in the system this type of operation can also assure accurate routing quickly obtained without the use of a computer.

In a manual mode wafers may be routed through the system by manually setting the direction of the intersections to form paths between processing units. To insure no collision or wafer shuffling no two paths may cross unless batch pulsing is used, i.e. process batches of wafer to a stop point make the intersection changes and release the batch. This is the only restriction for manual mode, however, it can be a severe restriction if a system to be manually controlled is used. In such a system operation serial throughput would be desirable where path crossing, with other traffic, would be by exception only.

In a manual mode each intersection in the path talks to each adjacent intersection in the path to ensure wafers never catch up with each other. This is termed "three point control". A wafer sent from one point, for example, A, sets the receiving point B busy. Point B remains busy until the wafer leaves point B and is received at point C. Only when a point either an intersection or a buffer position is not busy will it enable a sending location to release a wafer. Which point talks to which other point is automatically determined as a function of the direction control line for each intersection. One can readily see that in manual mode each path essentially becomes a large buffer type section where each point becomes a temporary storage position. Setting of the paths can be done in one of two ways. The central controller mentioned previously under automatic control has the option of allowing manual control of each quad intersection by means of front panel controls which set the direction and release lines for each intersection and buffer. With the aid of a map of the system one may set up paths and control wafer movement from one central location. In this mode only the address and control buss is used. Status information is not necessary.

In another manner the station controller which houses the electronics for sensing wafer presence, operating solenoids, accomplishing three point control, and the like also has a control panel by which control of the intersection can be attained. One must walk, under these conditions, from intersection to intersection. Other functions of the local controller are to provide test points for maintenance and controls to allow servicing wafers without opening up into the clean environment of the system.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A minimum volume enclosed semiconductor self-centering fluidic dual lane unidirectional transport system comprising the following interacting elements,
    a means for supplying a vectorized fluid cushion onto a transport surface and associated with,
    a means for circulating and filtering said fluid used as a transport means and coupled with,
    a means for adding make up fluid to the system in order to maintain a relatively constant volume pressure of fluid in said system and,
    having an interacting means for providing vacuum ports at specific system locations whereby vacuum eminating therefrom aids in the control of transport of work pieces for directing, and routing work pieces with,
    a means for cross over bidirectional intersections connected to,
    a means for entering and exiting work pieces to and from said system and associated with,
    a means for a storage hold up buffer connected to said system, and
    a means for work piece directional turn around with,
    a means for connecting said system with a multiplicity of processing units, and
    a means for providing the system with connected modular sections coupled with,
    a means for automatically controlling the transport of work pieces to and from processing unit stations and exit and inlet said work pieces to and from said system, and
    a means for fail safe interconnection of fluid and vacuum supply to said system connected to,
    a holding buffer and by pass directional turn around means juxtapostional to the entrance of each processing unit connected to said system.

2. A system in accordance with claim 1 wherein the fluid is air.

3. A system in accordance with claim 2 wherein said air is class 100 or less.

4. A system in accordance with claim 1 wherein said cross over bidirectional intersections is provided with vacuum ports for holding and centering the work piece in the course of travel in the system.

5. A system in accordance with claim 1 wherein said automatic control means is computer operated.

6. A system in accordance with claim 5 wherein said computer is semiautomatically or manually operated.

7. A system in accordance with claim 1 wherein the fluid is an inert gas.

8. A system in accordance with claim 1 wherein said congrol means provides for programmed random paths to and from process units.

9. A system in accordance with claim 1 wherein said control means provides preprogrammed by passing of specified process units by specifically identified work pieces.

10. A system in accordance with claim 1 wherein said vacuum supply ports are maintained in constant negative pressure mode.

11. A system in accordance with claim 1 wherein fluidic environmental conditions such as light wave length, temperature, particle content electrical charges are maintained in a desired condition.

12. A system in accordance with claim 1 wherein fluidic environmental atmosphere is at a pressure above ambient pressure.

13. A wafer transport system comprising,
    a plurality of dual lane fluid cushion track segments,
    an intersection control member connected to said segments at one end thereof, said member including vacuum ports and fluid pressure ports,
    a wafer entrance and exit member connected to one of said plurality of segments at the other end thereof,
    means for connecting a plurality of tools to said segments at the other ends thereof,
    enclosure means for confining said track segments and said intersection control member within a given volume,
    means for supplying filtered fluid into said enclosure means selectively through said pressure ports and through said track segments, said fluid being supplied at a pressure sufficiently high to produce within said enclosure means a pressure substantially higher than that of the ambient pressure,
    means coupled to said vacuum ports for selectively producing a vacuum at said intersection control member, and
    means for providing a fail-safe coupling between said fluid supply means and said vacuum producing means.

* * * * *